(12) United States Patent
Suzuki

(10) Patent No.: US 9,590,522 B2
(45) Date of Patent: Mar. 7, 2017

(54) MOTOR DRIVING SYSTEM

(71) Applicant: DENSO CORPORATION, Kariya, Aichi-pref. (JP)

(72) Inventor: Ryo Suzuki, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/878,201

(22) Filed: Oct. 8, 2015

(65) Prior Publication Data
US 2016/0181955 A1 Jun. 23, 2016

(30) Foreign Application Priority Data
Dec. 23, 2014 (JP) .................. 2014-259599

(51) Int. Cl.
H02P 6/16 (2016.01)
H02M 7/00 (2006.01)
H02P 27/06 (2006.01)

(52) U.S. Cl.
CPC .............. *H02M 7/00* (2013.01); *H02P 27/06* (2013.01)

(58) Field of Classification Search
CPC ........................................... H02P 6/16
USPC ........................ 318/400.04, 400.14
See application file for complete search history.

(56) References Cited

U.S. PATENT DOCUMENTS 8,115,423 B2 * 2/2012 Hanada ................ B60L 11/18
318/34
2009/0309528 A1 12/2009 Hanada et al.

FOREIGN PATENT DOCUMENTS

JP 2004-120966 A 4/2004

* cited by examiner

Primary Examiner — David S Luo
(74) Attorney, Agent, or Firm — Posz Law Group, PLC

(57) ABSTRACT

A motor driving system includes an offset value learning part, which learns offset values of current sensors, when all switching elements are in off-states and a motor driving circuit is in an off-state, in which the motor driving circuit generates no motor driving current. The offset value learning part includes a first learning part and a second learning part. The first learning part learns the offset value of the current sensor of each phase at an arbitrary motor rotation angle, when an induced motor voltage of a three-phase motor is smaller than an input voltage of the motor driving circuit. The second learning part sequentially learns the offset value of the current sensor of the phase, a phase voltage value of which varying with the motor rotation angle is intermediate, when the induced motor voltage is equal to or larger than the input voltage.

8 Claims, 11 Drawing Sheets

FIG. 5
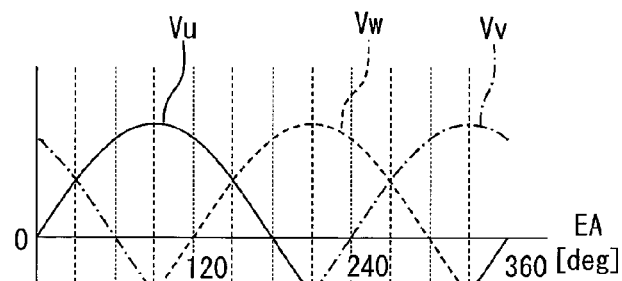
(a) INDUCED PHASE VOLTAGE [V]
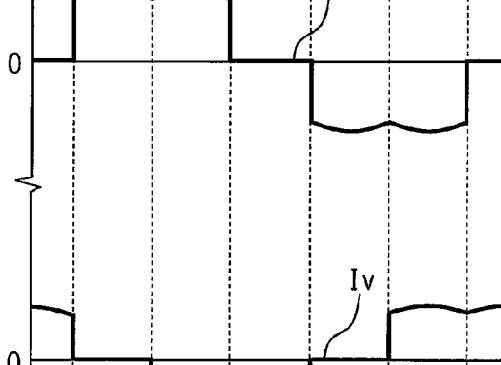
(b) U-PHASE CURRENT [A]
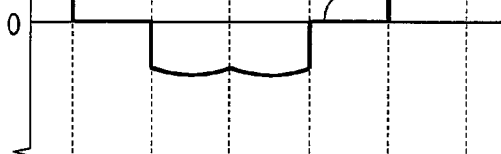
(c) V-PHASE CURRENT [A]
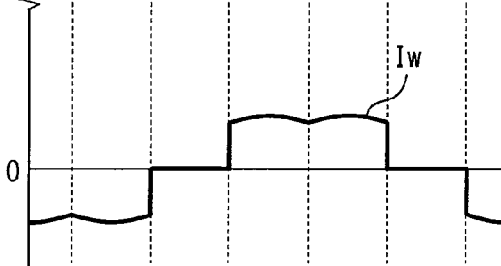
(d) W-PHASE CURRENT [A]

MOTOR DRIVING SYSTEM

CROSS REFERENCE TO RELATED APPLICATION

This application is based on Japanese patent application No. 2014-259599, filed on Dec. 23, 2014, the disclosure of which is incorporated herein by reference.

FIELD

The present disclosure relates to a motor driving system and, more particularly, to learning an offset value of a current sensor provided in the motor driving system.

BACKGROUND

In a motor driving system including a three-phase inverter circuit, which outputs motor driving currents supplied to a motor for driving a vehicle, an electronic control unit (ECU) is configured conventionally to feedback-control motor driving currents to drive the vehicle properly. Specifically, the ECU detects a current flowing in each phase of the three-phase inverter circuit by using a current sensor and determines a feedback control value by comparing a current detection value with a current command value for the motor.

In a case that the current detection value of the current sensor includes an offset, the feedback control value also includes the offset. As a result, the motor driving current of each phase fluctuates and causes torque variation, which results in poor performance in controlling the vehicle.

To counter this problem, patent document JP 2006-258745 A (US 2009/0309528 A1) proposes a technology to learn a quantity an offset (offset value) of the current sensor and correct the output of the current sensor (offset correction). Specifically, in a driving system having plural sets of motors and three-phase inverter circuits as well as a motor control ECU, in which a CPU is provided for driving each motor, the offset of the current sensor is corrected on condition that all of the three-phase inverter circuits are in non-conductive states (off-states) and no power is supplied to the motor. This condition corresponds to a state, in which the vehicle is in a travel stop state and in a regeneration stop state and a shift position of a transmission is neutral.

In the motor driving system disclosed in the above-described patent document, the CPU is reset occasionally because of an uncontrollable operation of the CPU in a course of traveling of the vehicle (shift position is in the drive range, that is, D-position). The offset value, which has been learned and stored in a volatile memory, is lost when the CPU is reset. The offset value need be learned again for controlling the vehicle with high accuracy. While the vehicle is traveling, the shift position is in the D-position, the condition for the offset correction is not satisfied and hence the offset of the current sensor cannot be corrected until the shift position is changed to the neutral range, that is, N-position. As a result, the feedback control is continued without the offset correction until the shift position is changed to the N-position. This continued feedback control causes poor control performance.

SUMMARY

It is therefore an object to provide a motor driving system, which is capable of learning an offset value of a current sensor even when a vehicle is traveling.

In one aspect, a motor driving system comprises a DC power source, a motor of three phases, a motor driving circuit, current sensors and a control circuit. The motor is connected to the DC power source for generating a rotary force when powered electrically. The motor driving circuit includes a plurality of switching elements and a plurality of rectifying elements connected in parallel to the switching elements, respectively, for generating motor driving currents from the DC power source for driving the motor by switching operations of the switching elements. The current sensors are provided in at least two phases among the three phases of the motor for detecting the motor driving currents. The control circuit controls the motor driving circuit in accordance with detection currents detected by the current sensors. The control circuit includes an offset value learning part for learning offset values of the current sensors when all the switching elements are turned off and the motor driving circuit is in an off-state, in which no motor driving current is generated. The offset learning part includes a first offset learning part, which learns the offset value of the current sensor of each phase at an arbitrary motor rotation angle in a case of Vmot<Vin. Vmot is an induced motor voltage of the motor and Vin is an input voltage of the motor driving circuit. The offset learning part includes a second offset learning part, which learns sequentially the offset value of the current sensor provided in a subject phase, which is one of the three phases and has a phase voltage value is intermediate in a case of Vmot≥Vin.

BRIEF DESCRIPTION OF THE DRAWINGS

FIG. 5 is a waveform chart showing the induced voltage and the phase currents of the motor in a case that Vmot is equal to or larger than Vin;

EMBODIMENT

First Embodiment

Figure 1:
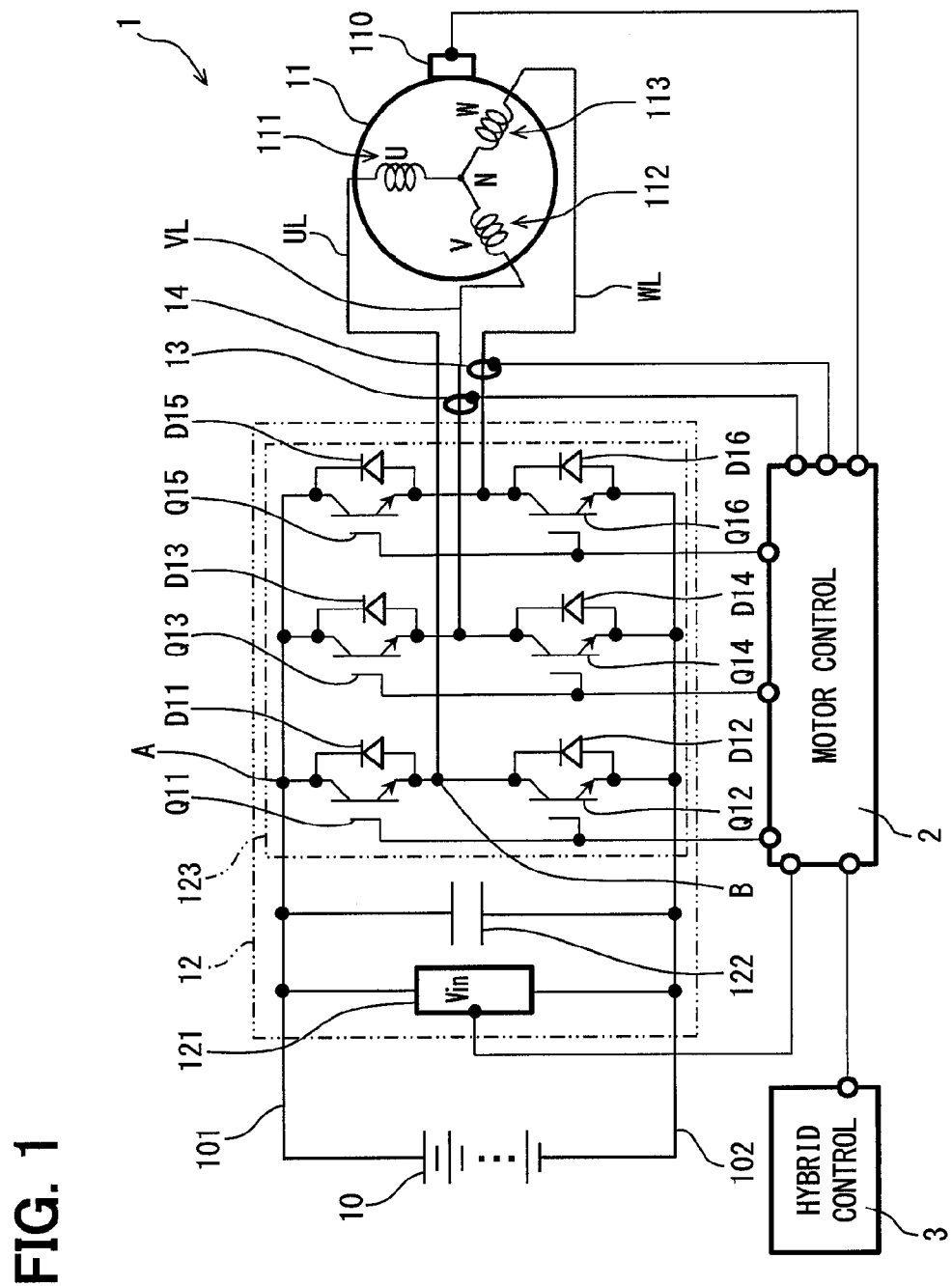
FIG. 1 is a circuit diagram of a motor driving system according to a first embodiment.

Referring first to FIG. 1, a motor driving system 1 for a vehicle includes a DC power source 10, a three-phase motor 11, a motor driving circuit 12, current sensors 13, 14, a motor control circuit 2 and a hybrid control circuit 3.

The DC power source 10 is connected to the three-phase motor 11 through the motor driving circuit 12. The DC power source 10 and the three-phase motor 11 are configured to be capable of mutually supplying and receiving electric power.

The DC power source 10 outputs a DC voltage between a positive-side power line 101 and a ground line 102. The DC power source 10 is configured to include a rechargeable secondary battery.

The three-phase motor 11 operates as a motor for generating a torque (driving force) for driving wheels of an electric vehicle at powering control time and as a generator for generating an AC voltage for charging the secondary battery included in the DC power source 10 at regenerative braking control time of the vehicle. The regenerative braking includes a foot-braking operation of a hybrid vehicle or an electric vehicle performed by a driver to cause regenerative power as well as decelerating the vehicle (or stopping acceleration) to cause the regenerative power generation by returning an accelerator pedal to a non-operated position without operating a braking pedal. The three-phase motor 11 has a U-phase coil 111, a V-phase coil 112, a W-phase coil 113 and a rotation angle sensor 110. The U-phase coil 111, the V-phase coil 112 and the W-phase coil 113 are connected commonly to a neutral point N.

The hybrid control circuit 3 and the motor control circuit 2 are connected to be capable of mutual communication. The hybrid control circuit 3 outputs a driving command signal (torque command, rotation speed command) to the motor control circuit 2, which responsively controls driving of the three-phase motor 11, and receives data related to an operation state of the three-phase motor 11 from the motor control circuit 2.

The motor driving circuit 12 includes a voltage sensor 121 for detecting an input voltage of the motor driving circuit 12, a smoothing capacitor 122 for smoothing the DC voltage supplied from the DC power source 10 and an inverter circuit 123 for converting the DC voltage supplied from the DC power source 10 to an AC voltage. The voltage sensor 121 and the smoothing capacitor 122 are connected between the power line 101 and the ground line 102.

The inverter circuit 123 is a three-phase inverter, which has three phases of a U-phase, a V-phase and a W-phase and a function of supplying the three-phase motor 11 with motor driving currents. The inverter circuit 123 is formed of power semiconductor switching elements (hereinafter referred to as switching elements) Q11 and Q12, which are connected in series to form a U-phase arm, switching elements Q13 and Q14, which are connected to form a V-phase arm, and switching elements Q15 and Q16, which are connected to form a W-phase arm. The switching elements Q11 to Q16 may be IGBTs.

Diodes D11 to D16 are connected in parallel between collector-emitter paths of the switching elements Q11 to Q16 in reverse-biased manners, respectively. The diodes D11 to D16 are provided to protect the switching elements Q11 to Q16 by fly-wheeling currents, which flow because of counter-electromotive forces generated in the three-phase motor 11, when the switching elements Q11 to Q16 are switched over from on-states to off-states. The switching elements Q11 to Q16 further rectify AC currents, which flow as a result of power generation, when the three-phase motor 11 generates power. The switching elements Q11, Q13, Q14 and the diodes D11, D13, D15 are occasionally referred to as a high-arm side (high-potential side) and the switching elements Q11, Q13, Q14 and the diodes D12, D14, D16 are occasionally referred to as a low-arm side (low-potential side).

The inverter circuit 123 includes a U-phase power line UL, a V-phase power line VL and a W-phase power line WL, which connect the three phases of the inverter circuit 123 and the three phases of the three-phase motor 11. The U-phase power line UL, the V-phase power line VL and the W-phase power line WL are referred to as a three-phase power line collectively. The diodes D11 to D16 are rectifying elements.

A middle point between the switching elements Q11 and Q12 is connected to the U-phase coil 111 through the U-phase power line UL. A middle point between the switching elements Q13 and Q14 is connected to the V-phase coil 112 through the V-phase power line VL. A middle point between the switching elements Q15 and Q16 is connected to the W-phase coil 113 through the W-phase power line WL.

The current sensor 13 is provided in the V-phase power line VL to detect the V-phase current Iv, which flows in the V-phase power line VL. The current sensor 14 is provided in the W-phase power line WL to detect the W-phase current Iw, which flows in the W-phase power line WL. The current sensors 13 and 14 are formed of semiconductor magnetic sensors such as Hall elements and generate output voltages, which correspond to the V-phase current Iv flowing in the V-phase line VL and the W-phase current Iw flowing in the W-phase power line WL, respectively. The current sensors 13, 14 are current sensors.

The motor control circuit 2 controls an operation of the motor driving system 1 so that motor driving control is performed in correspondence to motor driving commands for the three-phase motor 11. The motor control circuit 2 receives a rotation angle detected by the rotation angle sensor 110, a voltage value detected by the voltage sensor 121, current values Iv and Iw detected by the current sensors 13, 14 and other values detected by other sensors and uses those detection values for controlling driving of the three-phase motor 11. At powering control time, the motor control circuit 2 generates switching control signals and controls on/off states of the switching elements Q11 to Q16 so that the motor driving currents are supplied in correspondence to a torque command value for the three-phase motor 11. The switching control signal at powering control time is a signal for converting the DC voltage supplied between the power line 101 and the ground line 102 to the AC voltage applied to each phase coil 111 to 113 of the three-phase motor 11. At regenerative braking control time of the three-phase motor 11, the control circuit 2 generates regenerative-time switching control signals and switches overs on/off states of the switching elements Q11 to Q16 so that the induced AC voltage generated by the three-phase motor 11 is converted to the DC voltage between the power line 101 and the ground line 102. In the following description, the switching signal at powering time and the switching signal at regenerative time are referred to as the switching signal collectively.

The motor control circuit 2 feedback-controls the U-phase current Iu, the V-phase current Iv and the W-phase current Iw (referred to as phase current), which actually flow in the power lines UL, VL and WL of the three-phase motor 11, respectively, to follow a target current value corresponding to the torque command value of the three-phase motor 11. Assuming that an actual value of the motor driving current used in the feedback control is Iact (phase current Iu, IV, Iw), a current detection value of each current sensor 13, 14 provided in the corresponding phase is Idet and an offset value of each current sensor 13, 14 is Ioff, the motor driving current Iact is calculated by the following equation [1]. Ioff is a current detection value of the current sensor when Iact is 0.

$$Iact=Idet-Ioff \qquad [1]$$

In the first embodiment, two current sensors 13 and 14 are provided only in the V-phase power line VL and the W-phase power line WL among the three-phase power lines. Since a sum of currents of three phases is always 0 theoretically according to Kirchhoff's law, a U-phase current detection value Idet(u) is calculated from a V-phase current detection value Idet(v) of the V-phase and a W-phase current detection value Idet(w) of the W-phase among the three phases based on the following equation [2].

$$Idet(u)=0-Idet(v)-Idet(w) \qquad [2]$$

Current sensors may be provided in any two power lines of the three phases or in all power lines of the three-phases.

Figure 2:
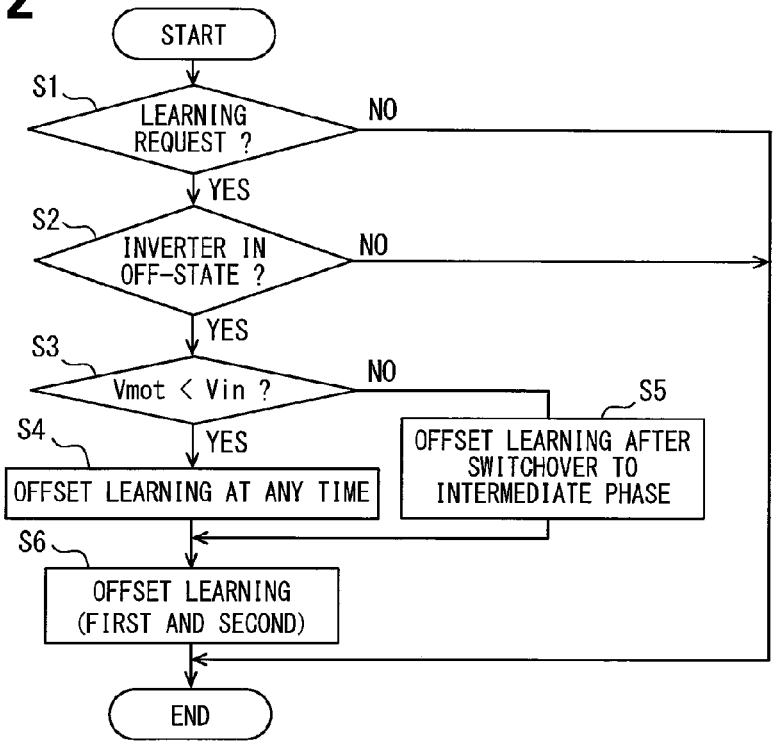
FIG. 2 is a flowchart showing an offset value learning routine in the first embodiment.

A learning routine for learning the offset value Ioff will be described with reference to FIG. 2.

Learning of the offset value Ioff is performed by the motor control circuit 2, the CPU of which executes control programs stored in a memory (not shown). First, it is checked at S1 whether a request signal for learning the offset value, that is, a learning request signal, is outputted from the hybrid control circuit 3 to the motor control circuit 2. The learning request signal may be outputted at any time after IG-ON (turn-on of power supply) before vehicle travel or at deletion of the offset value Ioff, which is stored at step S65 described later, from the motor control circuit 2, for example. Specifically, when the offset value Ioff stored at step S65 is deleted from the motor control circuit 2, a deletion confirmation signal is outputted from the motor control circuit 2 to the hybrid control circuit 3. When the hybrid control circuit 3 receives the deletion confirmation signal, the hybrid control circuit 3 outputs the learning request signal to the motor control circuit 2.

When it is determined at S1 that the learning request signal is not outputted (determined as NO), the learning routine of the offset value Ioff is finished. When it is determined at S1 that the learning request signal is outputted (determined as YES), it is checked at S2 whether the inverter circuit 123 is in the shut-off state (off-state). In this description, the off-state of the inverter circuit 123 means a state, in which the motor control circuit 2 stops outputting the switching control signals for the switching elements Q11 to Q16 and all of the switching elements Q11 to Q16 remain in the off-states without switching operations. When it is determined at S2 that the inverter circuit 123 is not in the off-state at S2 (determined as NO), the learning routine of the offset value Ioff is finished. When it is determined at S2 that the inverter circuit 123 is in the off-state (determined as YES), S3 is executed. It is checked which of the induced motor voltage Vmot of the three-phase motor 11 and the input voltage Vin of the three-phase motor 11 is larger.

Figure 3:
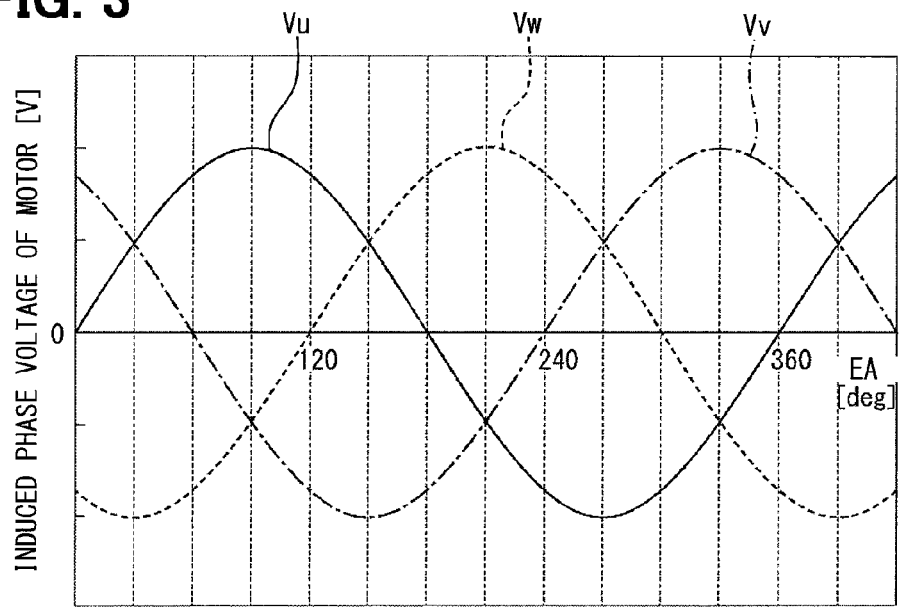
FIG. 3 is a waveform chart of an induced voltage of each phase in correspondence to a rotation angle of a three-phase motor.

Here a method of calculating the induced motor voltage Vmot of the motor 11 will be described. Each of the induced voltages Vu, Vv and Vw generally vary in a sine wave form of a cycle period of 360 degrees in electrical angle (EA) as shown in FIG. 3 in accordance with the rotation angle detected by the rotation angle sensor 110 provided in the three-phase motor 11. The induced motor voltage Vmot of the three-phase motor 11 is determined to be a maximum among three inter-line voltages Vuv, Vvw and Vwu, which are calculated as differences between two phase voltages among three phase voltages Vu, Vv and Vw. The input voltage Vin of the inverter circuit 123 is detected by the voltage sensor 121.

When it is determined at S3 that the induced motor voltage Vmot is smaller than the input voltage Vin (determined as YES), S4 is executed. When it is determined at S3 that the induced motor voltage Vmot is equal to or larger than the input voltage Vin (determined as NO), S5 is executed.

Figure 4:
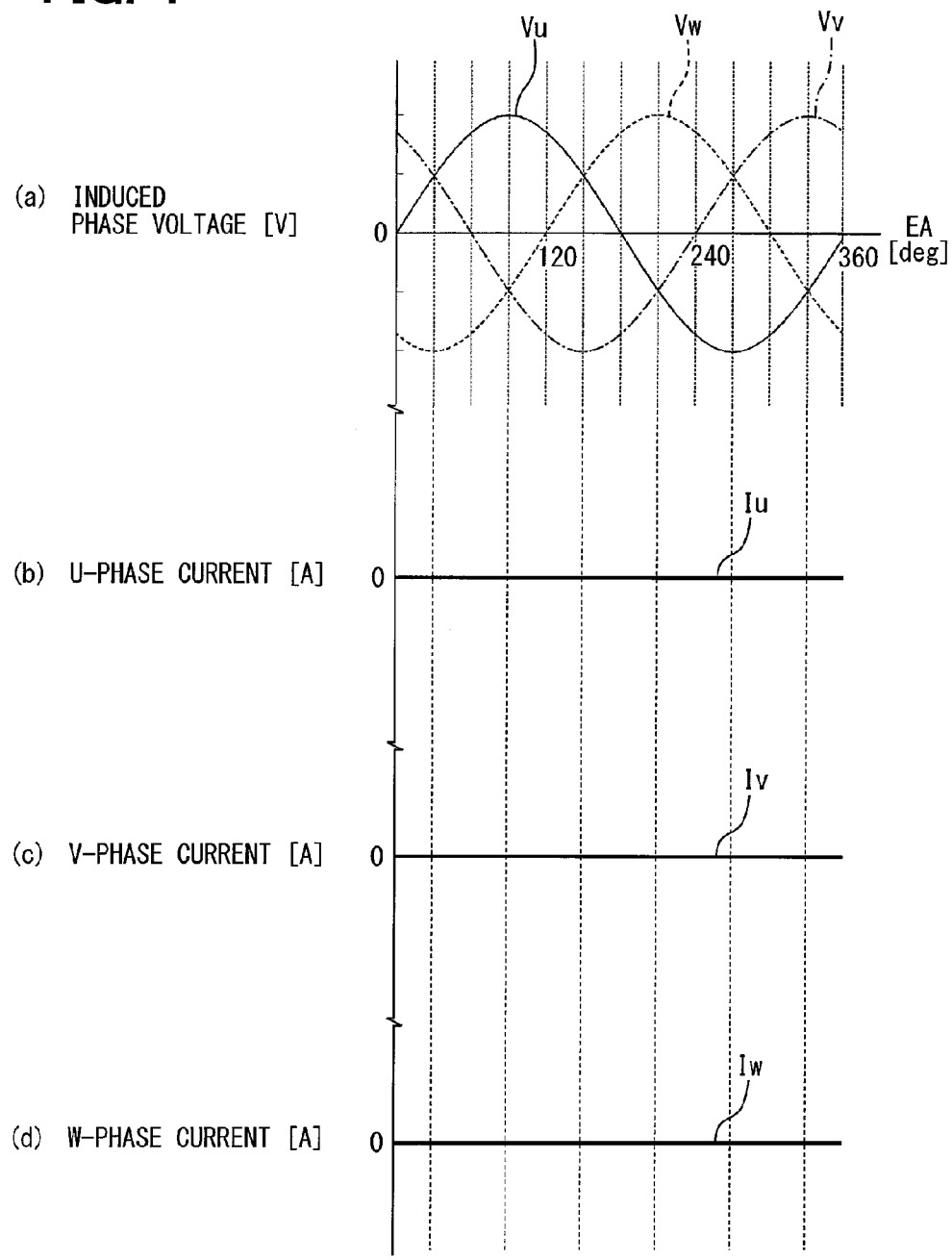
FIG. 4 is a waveform chart showing the induced voltage and phase currents of the motor in a case that Vmot is smaller than Vin.

When the induced motor voltage Vmot is smaller than the input voltage Vin, a current tends to flow from the power line 101 (point A) to the middle point (point B) in FIG. 1. However, the current is not allowed to flow because the switching element Q11 is in the off-state and the diode D11 is reverse-biased. That is, as shown in (b) to (c) of FIG. 4, no current flows in any of the three-phase power lines UL, VL and WL relative to the phase voltages shown in (a) of FIG. 4 at any rotation angles of the three-phase motor 11. The detection values Iv and Iw outputted from the current sensors 13 and 14 correspond to the offset values of the current sensors 13 and 14, respectively. It is thus possible to learn the offset values always irrespective of the rotation angles of the three-phase motor 11. It is determined at S4 that the learning of offset values of the current sensors 13 and 14 is possible at any arbitrary rotation angle of the three-phase motor 11. This processing of learning the offset values at S6 through S4 is referred to as a first learning part. The processing from S4 to S6 is referred to as an offset value learning part.

As described above, the induced phase voltage Vu, Vv, Vw of each phase varies with the rotation angle of the three-phase motor 11. When the induced motor voltage Vmot is equal to or larger than the input voltage Vin, the current Iu, Iv, Iw of each phase varies with changes in the induced phase voltage Vu, Vv, Vw as shown in FIG. 5. As shown in FIG. 5, no current flows in the power line, the induced voltage of which is intermediate among three induced phase voltages of the three-phase motor 11. For example, the U-phase current Iu is 0 when the induced phase voltage Vu is intermediate between the induced phase voltage Vv (low) and the induced phase voltage Vw (high), that is, Vu is higher than Vv and lower than Vw. This is because a current flows from a high potential side to a low potential side and currents flow in phases other than a phase of the intermediate voltage value. It is thus possible to learn the offset value of each phase, which is the subject phase for offset learning, only when the phase voltage of the subject phase becomes intermediate. Thus the subject phase, for which learning of the offset value is possible, varies with the rotation angle of the three-phase motor 11, that is, in the order from the U-phase, the V-phase and the W-phase cyclically. It is therefore determined at S5 that the learning of offset values is performed in sequence with respect to the current sensor provided in the phase, the induced voltage of which varying with the rotation angle of the three-phase motor 11 becomes intermediate (not highest nor lowest). The checking about possibility of learning at S5 may be delayed for a certain period in view of influence of a recovery current, which is developed as exemplarily shown in FIG. 7 at the time of switching over of the current supply phases. The processing of learning the offset value at S6 through S5 is referred to as a second learning part.

At S6, which is an offset learning execution step, the detection value of each current sensor 13, 14 is sampled a predetermined number of times at every predetermined sampling interval, when the V-phase current Iv of the current sensor 13 and the W-phase current Iw of the current sensor 14 becomes 0. Details of this processing will be described with reference to FIG. 6.

Figure 6:
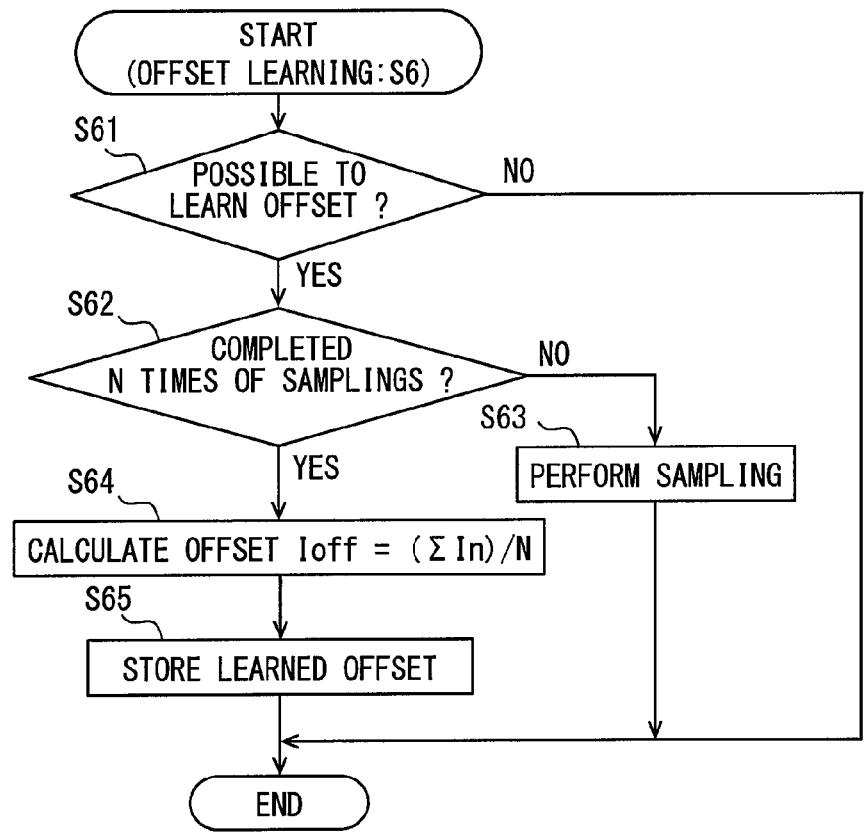
FIG. 6 is a sub-flowchart of an offset learning step shown in FIG. 2.

In FIG. 6, at S61, it is checked whether the phase provided with the current sensor, which is the subject phase for the offset learning, is allowed to be learned. Specifically, when S61 is executed following S4, it is determined that all the phases are always allowed to be learned because all of the phase currents are always 0 at any rotation angle of the three-phase motor 11 as described with reference to FIG. 4. When S61 is executed following S5, it is checked phase by phase whether the learning is allowed based on the rotation angle of the three-phase motor 11 as described with reference to FIG. 5.

When it is determined at S61 that the subject phase is not allowed to be learned (determined as NO), step of FIG. 6 is finished. When it is determined at S61 that the subject phase is allowed to be learned (determined as YES), it is checked at S62 whether the N times of samplings have been completed. N is the number of times of sampling required for learning the offset value. When it is determined at S62 that N times of samplings have not yet completed, more samplings are performed at S63 to attain the N times of samplings. When the sampling is performed at S63, the processing of FIG. 6 is finished. When it is determined at S62 that N times of samplings have been completed, S64 is executed. At S64, sampled current values I1 to In are added as I1+I2+ . . . +In, and the resulting sum ΣI is divided by the number of times N of samplings thereby to calculate an average value (ΣI)/N. This calculated value is learned as the offset value Ioff.

After learning the offset value Ioff, the three-phase motor 11 is driven with the feedback control by calculating Iact in accordance with the equation [1] using the learned offset value Ioff. Then, the offset value Ioff learned at S64 is stored at S65 and the routine of learning the offset value Ioff is finished.

In the first embodiment described above, the learning routine for learning the offset value Ioff is finished when the offset value Ioff is learned once (S65 is performed). This learning routine may be repeated from S61.

The first embodiment described above performs the following operation and provides the following advantages.

(1) When the inverter circuit 123 is in the off-state, the motor control circuit 2 learns the offset values of the current sensors 13 and 14 by the first learning part (S4, S6) or the second learning part (S5, S6) based on the relation between magnitudes of the induced motor voltage Vmot of the three-phase motor 11 and the input voltage Vin of the motor driving circuit 12. When the induced motor voltage Vmot is smaller than Vin, no current flows from each phase of the three-phase motor 11 to the DC power source 10 side because the direction of current flow is opposite to the current flow directions of the diodes D11 to D16. It is therefore possible to learn the offset values at any arbitrary rotation angles of the three-phase motor 11. When the induced motor voltage Vmot is equal to or greater than the input voltage Vin, the current flows to the three-phase motor 11 through the diodes D11 to D16. Generally no current flows in the subject phase for offset learning, the induced phase voltage of which is intermediate among all phases. It is therefore possible to learn the offset value of the subject phase at the motor rotation angle, at which the induced voltage of the subject phase for learning the offset value becomes intermediate among all phases. It is thus possible to learn the offset values of all phases by sequentially learning the offset value of each phase, the induced voltage value of which varying with the rotation angle of the three-phase motor 11 becomes intermediate. According to the above-described operation, the offset value can be learned even when the three-phase motor 11 generates the induced motor voltage Vmot, that is, even when the three-phase motor 11 is rotating as in traveling of the vehicle. As a result, even when the offset values learned previously are deleted from the motor control circuit 2 while the vehicle is traveling, the offset value correction can be made without stopping the vehicle and the three-phase motor 11 can be controlled with high precision.

(2) As described in (1), it is possible to learn new offset values without stopping the vehicle even when the offset values learned previously are deleted from the motor control circuit 2 during traveling of the vehicle. It is thus not needed to stop the vehicle to learn the offset values in a state, which a user does not intend.

Figure 7:
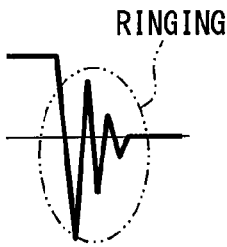
FIG. 7 is a waveform chart showing a recovery current included in the phase current.

(3) In the inverter circuit 123, when the switching elements Q11 to Q16 are switched over from the on-states to the off-states under a state that currents are flowing in the switching elements Q11 to Q16, the currents flowing to the three-phase motor 11 change to flow as the recovery currents through the diodes D11 to D16. Such recovery currents induce oscillation called ringing in the phase currents as shown in FIG. 7 and there arises substantially a period, in which the current value does not become 0. In the first embodiment, at the offset learning execution step S5 for learning the offset value of each phase, the learning may be allowed after a certain time delay from the switchover of phases, which are subject phases for the offset learning. After this certain time delay, the subject phase for learning is determined at S6 and learning of the offset value is started. As a result, it is possible to learn the offset value at the time when the phase current value becomes substantially 0 without being affected by the recovery current. It is thus possible to perform the offset value learning with high precision in comparison with the offset value learning performed at the time when the phase current value theoretically becomes 0.

Second Embodiment

A second embodiment will be described next with reference to FIG. 8 to FIG. 11. The same configuration and operation as those of the first embodiment will be simply described or omitted.

According to the second embodiment, a motor driving system 100 is configured to have plural motor driving systems 1 described in the first embodiment. Specifically, the motor driving system 100 is formed of a DC power source 10, three-phase motors 11a to 11c, inverter circuits 123a to 123c provided in correspondence to the three-phase motors 11a to 11c, current sensors 13a to 13c provided in V-phase power lines of the three-phase motors 11a to 11c and current sensors 14a to 14c provided in W-phase power lines of the three-phase motors 11a to 11c. Although the motor driving system 100 also includes a motor control circuit 2 and a hybrid control circuit 3 as in the first embodiment, those circuits 2 and 3 are not shown in FIG. 8. Each of the inverter circuits 123a to 123c is connected in series to the DC power source 10 and in parallel one another. A set of one three-phase motor, one motor driving circuit and current sensors provided in power lines of two phases among three phases form one set of motor driving system. The three-phase motors 11a and 11b generate driving forces for front wheels of a vehicle, in which the motor driving system 100 is mounted, at the powering control time and generates AC voltages to charge a secondary battery provided in the DC power source 10 at the regenerative braking control time. The regenerative braking includes a foot-braking operation of a hybrid vehicle or an electric vehicle performed by a driver to cause regenerative generation as well as decelerating the vehicle (or stopping acceleration) to cause the regenerative generation by returning an accelerator pedal to a non-operated position without operating a braking pedal. The three-phase motor 11*c* generates driving force for rear wheels of the vehicle, in which the motor driving system 100 is provided, at the powering control time. The three-phase motor 11*c* also generates an AC voltage to charge a secondary battery provided in the DC power source 10 at the regenerative braking control time.

Figure 9:
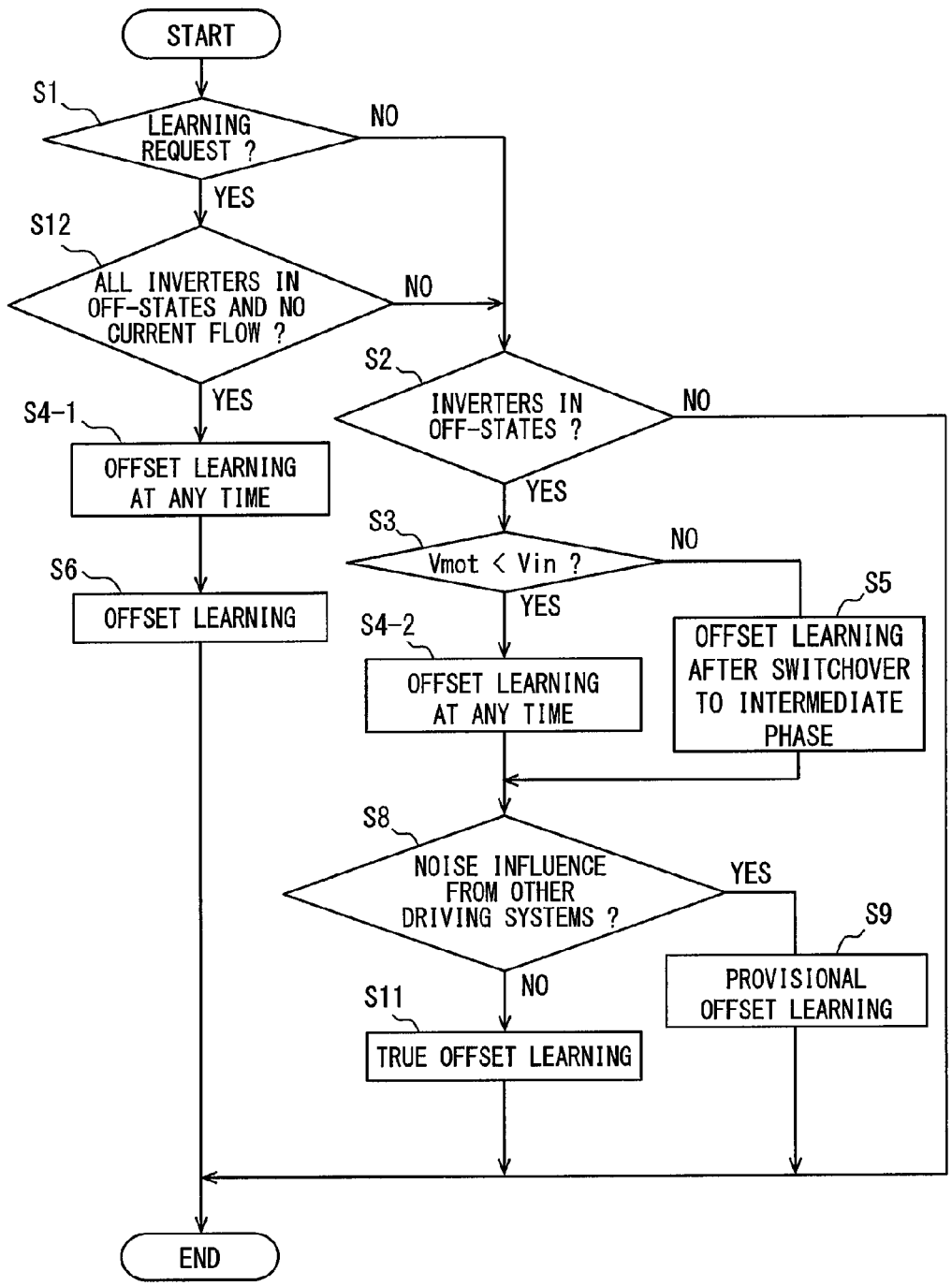
FIG. 9 is a flowchart showing an offset value learning routine in the second embodiment.
Figure 10:
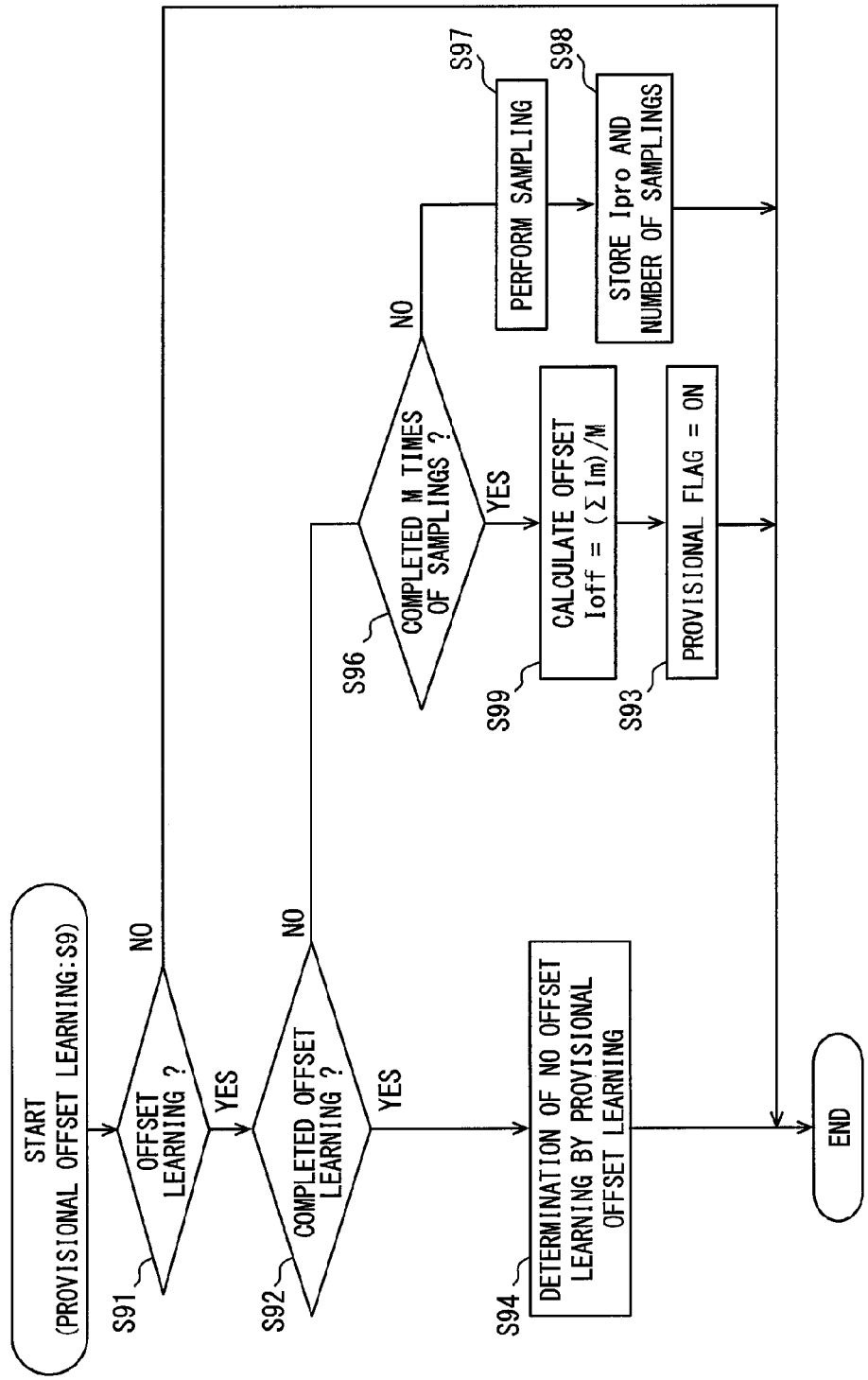
FIG. 10 is a sub-flowchart of a provisional offset learning step shown in FIG. 9.

In an offset value learning routine in the second embodiment, as shown in FIG. 9, it is checked first at S1 whether a request signal for learning an offset value is outputted from the hybrid control circuit 3 to the motor control circuit 2. The learning request signal may be outputted at any time after IG-ON and before vehicle travel or at deletion of a true offset value, which is stored at step S119 described later, from the motor control circuit 2, for example. Specifically, when it is confirmed by a true offset value deletion check part (not shown) that the true offset value stored at step S119 is deleted from the motor control circuit 2, a true offset value deletion confirmation signal is outputted from the motor control circuit 2 to the hybrid control circuit 3. When the hybrid control circuit 3 receives the true offset value deletion confirmation signal, the hybrid control circuit 3 outputs the learning request signal to the motor control circuit 2. The processing of S4-1 and S4-2 in FIG. 9 is similar to S4 described in the first embodiment (S4-1 and S42 are referred to as S4).

When it is determined at S1 that the learning request signal is outputted (determined as YES), it is checked at S12 whether all the inverter circuits 123*a* to 123*c* are in off-states and no-current flow states between the inverter circuits 123*a* to 123*c* and the three-phase motors 11*a* to 11*c*. The no-current flow states mean that all the three-phase motors 11*a* to 11*c* are in non-rotating states. When it is determined at S12 that all the inverter circuits 123*a* to 123*c* are in the off-states and no-current flow states, S4-1 is executed as a portion of the first learning part and then the offset value learning execution step S6 is executed. When the offset value is learned at S6, the learning routine of the offset value is finished. Using the offset value learned at S6 as the true offset value, the motor control circuit 2 feedback-controls the motor driving current, which is calculated based on the equation [1]. When it is determined at S12 that at least one of the inverter circuits 123*a* to 123*c* is not in the off-state nor the no-current flow state, S2 is executed in the similar manner as in the first embodiment. It is determined at S4-2 or S5, which follows S3 after S2, at which timing the offset value is learned. At S8, it is checked whether the learning subject system, in which the current sensor for the offset value learning, is influenced by the motor driving circuit of other motor driving systems, which are not subjected to the offset value learning. S8 is a noise check part.

Specifically, it is checked at S8 whether all phase current values (that is, Iu, Iv and Iw) of the three-phase motor, which corresponds to the motor driving circuit in the other motor driving systems different from the learning subject system, are 0. For example, assuming that the current sensors, which are subjected to the offset value learning, are the current sensors 13*a* and 14*a* of one motor driving system (first motor driving system), it is checked whether the phase current values of the three-phase motors 11*b* and 11*c* provided in correspondence to the motor driving circuits 12*b* and 12*c* of the other motor driving systems (second and third motor driving systems), which are different from the motor driving system provided with the current sensors 13*a* and 14*a*, are all 0.

Whether all phase currents are 0 may be checked by conventional methods. For example, when the detection values of the current sensors provided in two phases among the three phases in each motor driving system are both 0, it is determined that all phase currents are 0. When at least one of the detection values of the current sensors provided in the two phases among the three phases is not 0, it is determined that all phase current is not 0. When all phase current values are 0, it is determined that no switching noise is influential. When all phase current values is not 0, it is determined that the switching noise is influential. Each phase current of the motor is considered to be 0, when it is exactly 0 or within a predetermined range around 0. This range may be set appropriately.

When it is determined at S8 that noise is influential (determined as YES), the provisional offset learning execution step S9 is executed. At S9, the offset value is calculated by performing a predetermined number of samplings in the same manner as in the first embodiment. Details of S9 will be described with reference to FIG. 10. First at S91, it is checked whether the phase current of the learning subject phase, for which the current sensor is provided as the subject sensor for learning the offset value, is 0. When it is determined at S91 that the phase current is not 0 (determined as NO), the provisional offset learning execution step S9 is finished.

When it is determined at S91 that the phase current is 0 (determined as YES), S92 is executed. It is checked at S92 whether the offset value has already been learned. S92 is a learning completion checking part.

When it is determined at S92 that the offset value has already been learned (determined as YES), S94 is executed. At S94 it is determined that the offset value need not be learned. S94 is a non-learning determination part. After S94, the provisional offset learning execution step S9 is finished. The offset value, which has already been learned, is a learned provisional offset value.

When it is determined at S92 that the offset value has not been learned yet (determined as NO), S96 is executed. It is checked at S96 whether the samplings have been performed a number of times M. M is an arbitrary value. When it is determined at S96 that the number of samplings does not reach the predetermined number M, S97 is executed to perform more sampling. After the sampling is executed at S97, S98 is executed. The motor control circuit 2 stores at S98 a total value Ipro of the current values sampled at S97 and the number of samplings. S98 is a storing part. After S98, the processing of FIG. 9 is finished.

When it is determined at S96 that the number of samplings reached M (determined as YES), S99 is executed. At S99, the sampled current values are added as $\Sigma$Im and divided by the number of samplings M and a resulting average value ($\Sigma$Im)/M is learned as the offset value Ioff. When the offset value is calculated at S99, a provisional offset value calculation flag is set to ON at S93 as setting the learned offset value to be the provisional offset value. After S93, the provisional offset learning execution step S9 is finished. When S92 is executed after the provisional offset value calculation flag is set to ON once, S94 is executed when the provisional offset value calculation flag is set to ON. When the provisional calculation flag is set to OFF, S96 is executed.

After the provisional offset learning execution step S9, the processing described above is repeated from S1.

When it is determined at S8 that the noise is not influential (determined as NO), a true offset learning execution step S11 is executed. At S11, similarly to the first embodiment, the offset value is calculated by the predetermined number of samplings. Details of S11 will be described with reference to FIG. 11.

It is checked first at S110 whether the phase current of the learning subject phase provided with the current sensor, the offset value of which is to be learned, is 0. When it is determined at S110 that the phase current is not 0 (determined as NO), the true offset learning execution step S11 is finished. When it is determined at S110 that the phase current is 0 (determined as YES), S111 is executed.

At S111, it is checked whether the offset value has already been learned. S111 is the learning completion checking part. When it is determined that the offset value has already been learned (determined as YES), S112 is executed.

Figure 11:
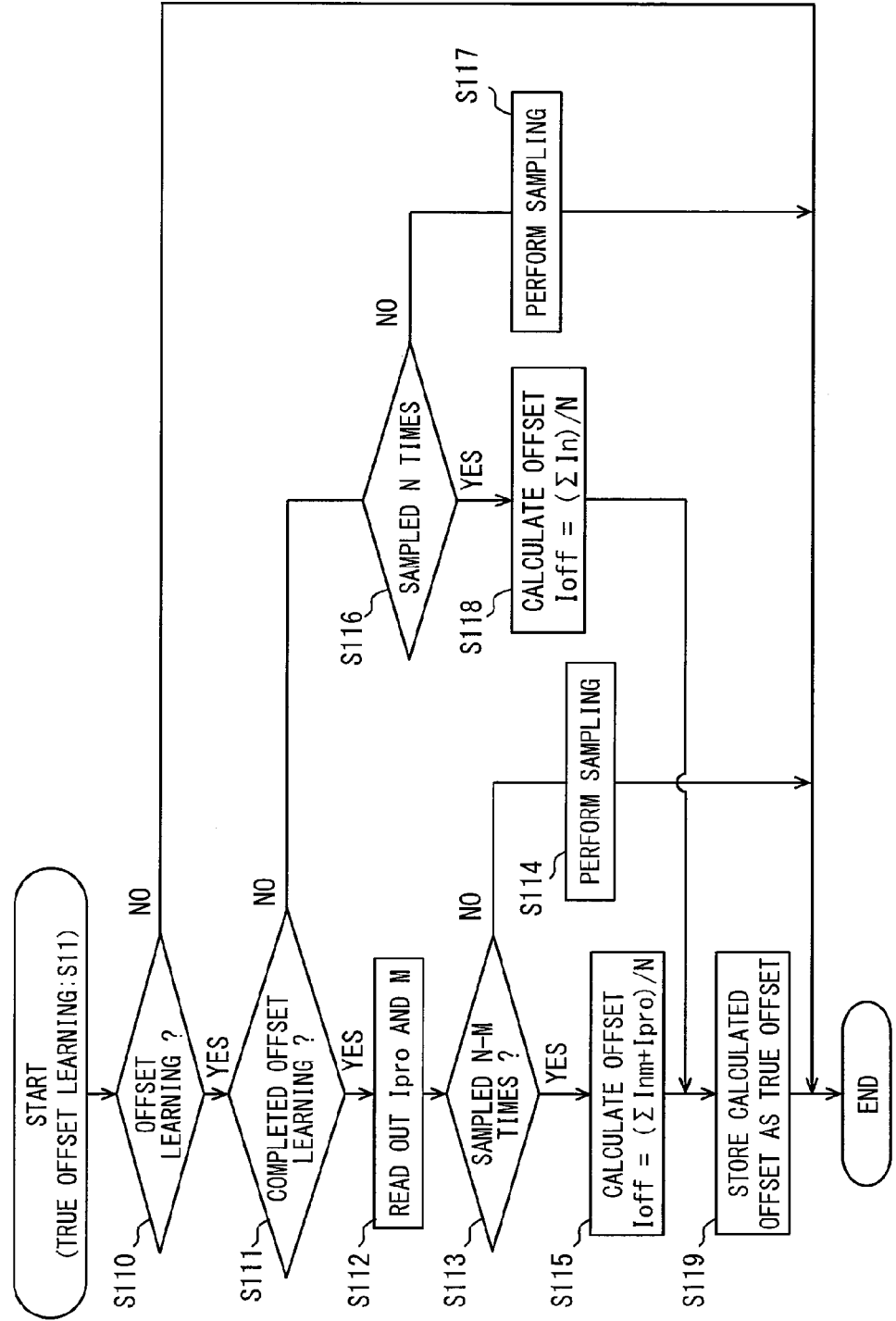
FIG. 11 is a sub-flowchart of a true offset learning step shown in FIG. 9.

At S112, the total of the current values Ipro sampled at S97 and the number of samplings M, which are stored at S98, are read out. After reading out the total of the current values Ipro sampled at S97 and the number of samplings M at S112, S113 is executed. It is assumed here that the number of samplings required at the true offset learning execution step S11 is N. N is larger than M. It is checked at S113 whether the samplings have been performed N-M times. When it is determined at S113 that the samplings of N-M times have not been performed yet (determined as NO), S114 is executed. At S114, sampling is performed. After the sampling is performed at S114, the processing of FIG. 11 is finished. When it is determined at S113 that the samplings of N-M times have been performed (determined as YES), S115 is executed.

At S115, a total of the current values sampled N-M times (that is, $\Sigma Inm$) and the total of the current values Ipro read out at S112 are added and this sum $\Sigma Inm+Ipro$ is divided by N. Then a calculated average value $(\Sigma Inm+Ipro)/N$ is learned as the offset value Ioff. When the offset value Ioff is learned at S116, the true offset learning execution step S11 is finished through S119 described later.

When it is determined at S111 that the offset value has not been learned yet (determined as NO), S116 is executed. It is checked at S116 whether the samplings have been performed N times. When it is determined at S116 that the samplings have not been performed N times yet (determined as NO), S117 is executed to perform the sampling further. After sampling at S117, the processing of FIG. 11 is finished. When it is determined at S116 that the samplings have been performed N times (determined as YES), S118 is executed. At S118, the total of the current values of samplings of N times (that is, $\Sigma In$) divided by N and the calculated average value $(\Sigma In/N)$ is learned as the offset value Ioff. After learning the offset value Ioff at S118, S119 is executed to store the learned offset value as the true offset value. S119 is a true offset value storing part. After storing the true offset value at S119, the true offset learning execution step S11 is finished. The offset value learned at the second offset value execution step S11 described above is referred to as the true offset value. After the true offset learning execution step S11, the learning routine of the offset value Ioff shown in FIG. 11 is finished.

In the second embodiment, when it is determined at S8 that noise is influential, the provisional offset value is learned at the provisional offset learning execution step S9 so that the motor control circuit 2 performs the feedback control by the calculation of equation [1] using the learned provisional offset value. The calculated offset value is learned as the provisional offset value, because it is possible to perform the feedback control based on the provisional offset value even when it is not possible to calculate the true offset value. When it is determined at S8 that the noise is not influential, the true offset value is learned at the true offset learning execution step S11. The motor control circuit 2 performs the feedback control by the calculation of equation [1] using the learned true offset value. When it is determined at S8 that no noise is influential, that is, determined as YES, is referred to a first condition.

When it is determined at S8 that no noise is influential under a state that the offset value has not been learned in the motor control circuit 2, the true offset value is learned at the true offset learning execution step S11 so that the feedback control is performed by using the learned true offset value.

Once the provisional offset value is learned at the provisional offset learning execution step S9, the feedback control is performed by using the provisional offset value until the true offset value is learned at the true offset learning execution step S11. After the true offset value is learned at the true offset learning execution step S11, the feedback control is performed by using the true offset value learned at S11 in place of the provisional offset value, which has been used in the feedback control.

At S8, the motor control circuit 2 need not control the inverter circuits so that all phase current values of the three-phase motors, which are provided in correspondence to the motor driving systems different from the learning subject system provided with the current sensor for offset learning, becomes 0. For example, it is possible to determine at S8 that there is no noise in consideration of a period of a vehicle stop at a traffic light, where the three-phase motors stop rotation.

An operation and advantage of the second embodiment will be described below.

(1) The motor control circuit 2 feedback-controls the motor driving current by using the provisional offset value learned at the provisional offset learning execution step S9 until the true offset value is learned at the true offset learning execution step S11. As a result, it is possible to start the feedback control at earlier time than in the conventional system, in which the motor driving current is not feedback-controlled until the true offset value is learned.

(2) The motor control circuit 2 feedback-controls the motor driving current by using the true offset value in place of the provisional offset value, when the true offset value is learned at the true offset learning execution step S11 under a state that the provisional offset value learned at the provisional offset learning execution step S9 is already available. As a result, it is possible to feedback-control the motor driving current with higher accuracy in comparison to continuation of the feedback control, which is performed by using the provisional offset value.

(3) At S115 in the learning routine of the offset value, the true offset value is calculated by using the current value Ipro sampled to learn the provisional offset value at S97 and the number of samplings M and using the current value sampled to learn the true offset value at S114 and the number of samplings N-M. As a result, it is possible to shorten the period required to learn the true offset value in comparison to a case of N times of samplings required to learn the true offset value.

Third Embodiment

A third embodiment of a motor driving system will be described below with reference to FIG. 12 and FIG. 13. The same configuration and operation as those of the first embodiment or the second embodiment will be simply described or omitted.

Figure 8:
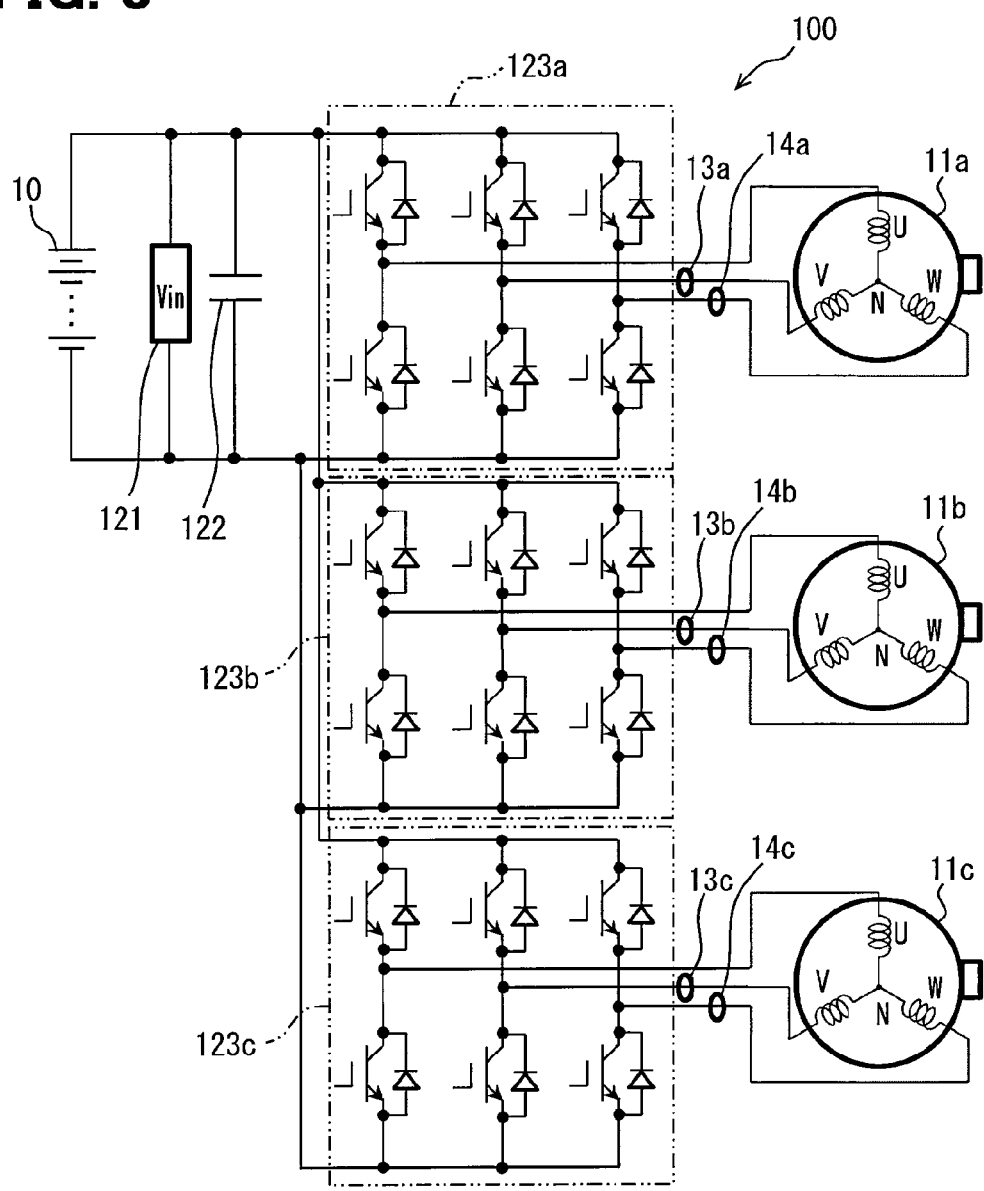
FIG. 8 is a circuit diagram of a motor driving system according to a second embodiment.
Figure 12:
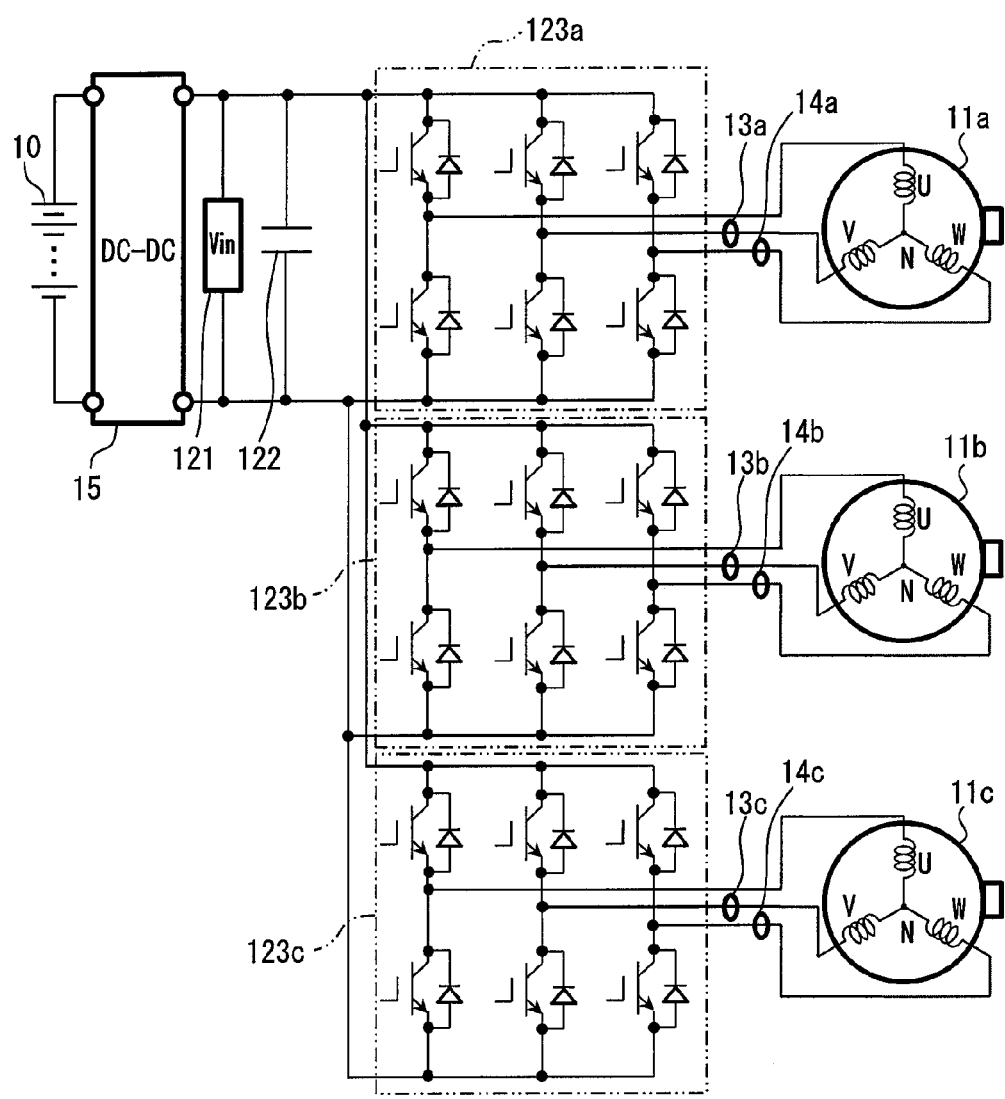
FIG. 12 is a circuit diagram of a motor driving system according to a third embodiment.

According to the third embodiment, in the motor driving system 100 of the second embodiment shown in FIG. 8, a DC-DC converter circuit 15 is provided between the DC power source 10 and the motor driving circuit 12 as shown in FIG. 12. The DC-DC converter circuit 15 is formed of plural switching elements, which are not shown. The DC-DC converter circuit 15 steps up or down a voltage by turning on and off the plural switching elements in response to control signals from the motor control circuit 2.

Figure 13:
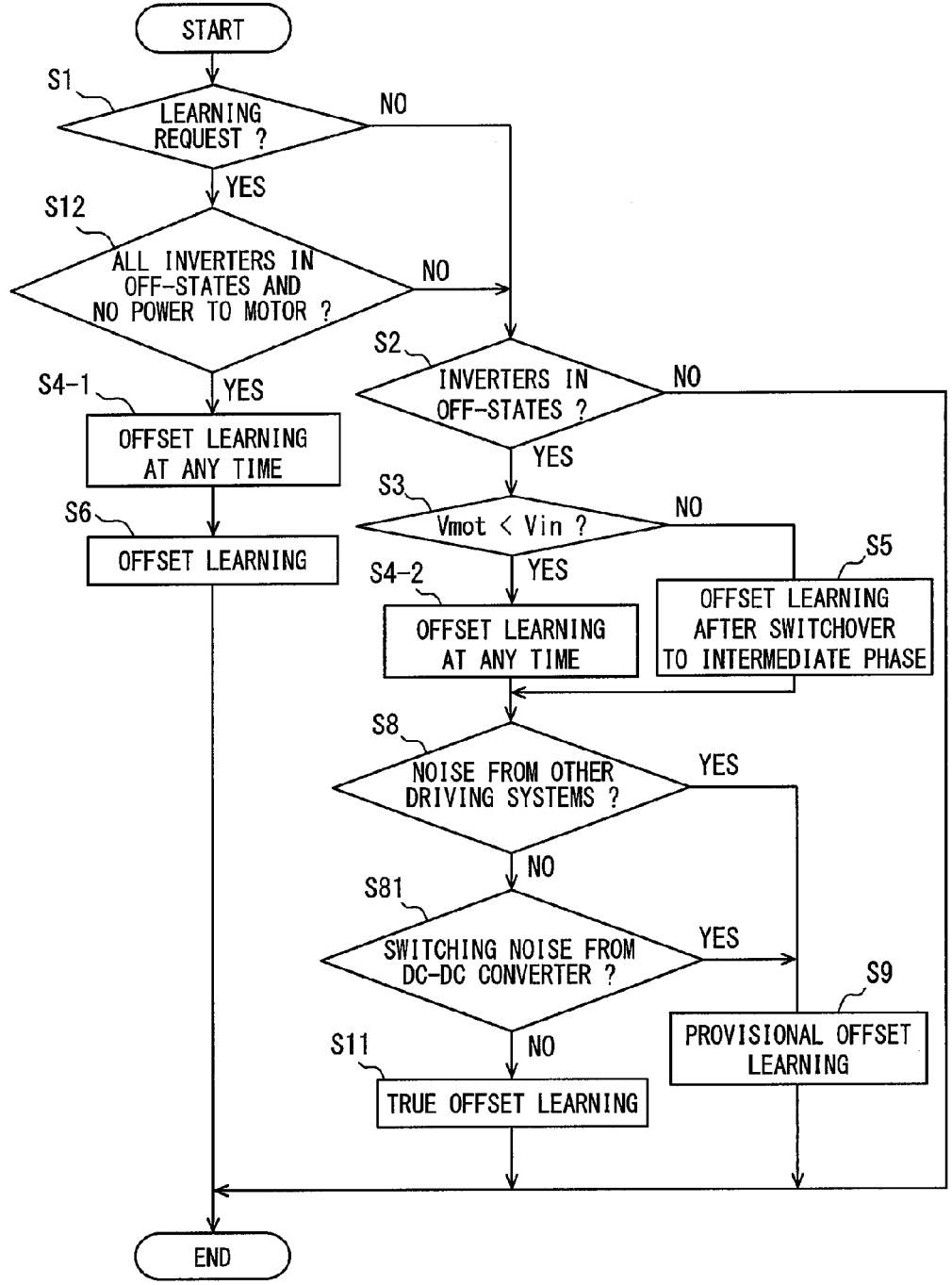
FIG. 13 is a flowchart showing an offset value learning routine in the third embodiment.

In a learning routine of the offset value in the third embodiment shown in FIG. 13, when it is determined at S8 that no switching noise is influential from the other driving systems (determined as NO), S81 is executed. The details of the processing S4-1 and S4-2 in FIG. 9 are similar to S4 described above. S4-1 and S4-2 are referred collectively as S4. It is checked further at S81 whether the switching noise from the DC-DC converter circuit 15 is influential to the learning subject system provided with the current sensor, the offset value of which is to be learned.

Specifically, it is checked at S81 whether the voltage between the terminals of the DC power source 10 is equal to the input voltage Vin to the inverter circuit in the system of the learning subject current sensor, the offset value of which is to be learned. The switching noise is generated when the switching elements of the DC-DC converter circuit 15 are turned on and off in response to the control signals from the motor control circuit 2. When the voltage Vpow of the DC power source 10, which is the input voltage to the DC-DC converter circuit 15, and the input voltage Vin to the inverter circuit, which is the output voltage from the DC converter circuit 15, are equal to each other, the switching elements in the DC-DC converter circuit 15 are not in operation. Therefore no switching noise generates in this state. For this reason, it is determined at S81 that no noise is influential from the DC-DC converter circuit 15 when it is determined at S81 that Vpow is equal to Vin.

When it is determined at S81 that no noise is influential (determined as NO), S11 is executed. Then the true offset learning is performed similarly to learn the true offset value as in the second embodiment described above. When it is determined at S81 that the switching noise is influential (determined as YES), S9 is executed. Then the provisional offset learning is performed similarly to learn the provisional offset value as in the second embodiment described above. The state, which is determined that no noise is influential, that is determined as NO, corresponds to a second condition.

According to the third embodiment, it is required that the switching noise caused by the DC-DC converter circuit 15 is not influential as the condition for calculating the true offset value. For this reason, in the configuration including the DC-DC converter circuit 15, it is possible to learn the offset value with less influence of noise. As a result, it is possible to perform the feedback control with higher accuracy.

The motor driving systems 1 and 100 are not limited to the embodiments described above but may be implemented differently as other embodiments. For example, the DC-DC converter circuit 15 is provided in the motor driving system 100, which includes plural systems of the three-phase motors 11a to 11c, in the third embodiment. It is however also possible to provide the DC-DC converter circuit 15 in the motor driving system 1 of the single system, which includes only one three-phase motor 11 as in the first embodiment. In this case, the switching noise checking part S8, which checks whether the switching noise of the DC-DC converter circuit 15 in the third embodiment, may be added to the learning routine of the offset value Ioff.

What is claimed is:

1. A motor driving system comprising:
   a DC power source;
   a motor of three phases connected to the DC power source for generating a rotary force when powered electrically;
   a motor driving circuit including a plurality of switching elements and a plurality of rectifying elements connected in parallel to the switching elements, respectively, for generating motor driving currents from the DC power source for driving the motor by switching operations of the switching elements,
   current sensors provided in at least two phases among the three phases of the motor for detecting the motor driving currents; and
   a control circuit for controlling the motor driving circuit in accordance with detection currents detected by the current sensors, wherein
   the control circuit includes an offset value learning part for learning offset values of the current sensors when all the switching elements are turned off and the motor driving circuit is in an off-state, in which no motor driving current is generated,
   the offset learning part includes a first offset learning part, which learns the offset value of the current sensor of each phase at an arbitrary motor rotation angle in a case of Vmot<Vin, Vmot being an induced motor voltage of the motor and Vin being an input voltage of the motor driving circuit, and
   the offset learning part includes a second offset learning part, which learns sequentially the offset value of the current sensor provided in a subject phase, which is one of the three phases and has a phase voltage value is intermediate in a case of Vmot≥Vin.

2. The motor driving system according to claim 1, wherein:
   the motor and the motor driving circuit provided in correspondence to the motor are provided to form one system of a plurality of motor driving systems, noise of which are influential one another when the motor is in rotation;
   the control circuit includes a noise checking part for checking whether a noise generated from the motor driving circuit different from the motor driving circuit, which is provided in a subject system for learning and in the off-state, is influential to the motor driving circuit in the off-state;
   the control circuit, assuming that the offset values learned by the offset learning part when the noise checking part determines that the noise of the motor driving circuit of the systems is influential and non-influential to the subject system are a provisional offset value and a true offset value, respectively, continues to learn the offset value by the offset value learning part until the true offset value is learned when the provisional offset value is learned; and
   the control circuit corrects a zero point of the current sensor provided in the subject system in accordance with the provisional offset value.

3. The motor driving system according to claim 2, wherein:
   the offset value learning part includes a learning completion checking part for checking whether the provisional offset value has already been learned before learning the offset value of the current sensor, and a learning non-execution determination part for determining that no provisional offset value need be learned, when the learning completion checking part determines that the provisional offset value has already been learned and the noise checking part determines that the noise is influential; and the control circuit corrects the zero point of the current sensor in accordance with a learned provisional offset value, which is the provisional offset value having already been learned, when the learning non-execution determination part determines that no provisional offset value need be learned.

4. The motor driving system according to claim 3, wherein:

the offset value learning part samples current values detected by the current sensor at a predetermined time interval and learns an average value of sampled current values as the offset value;

the control circuit includes a storing part for storing sampled current values to be used in learning the offset value by the offset value learning part; and the control circuit learns the true offset value by the offset value learning part based on the sampled current values and a number of samplings stored in the storing part at a previous learning of the provisional offset value and a sampling data newly sampled, when the learning completion checking part determines that the provisional offset value has already been learned and the noise check part determines that no noise is influential.

5. The motor driving system according to claim 2, wherein:

the control circuit includes a true offset value storing part for storing the true offset value learned by the offset value storing part and a true offset value deletion checking part for checking whether the true offset value is deleted from the true offset value storing part; and the control circuit starts to learn the offset value of the current sensor by the offset value learning part in response to a determination of deletion of the true offset value by the true offset value deletion checking part.

6. The motor driving system according to claim 2, wherein:

the noise checking part determines that no noise is influential when a first condition is satisfied in the motor driving circuit different from the driving circuit in the subject system provided with the current sensor, the offset value of which is to be learned, the first condition being that current values of all phases of the motor provided in correspondence to the motor driving circuit provided in a non-subject system different from the subject phase.

7. The motor driving system according to claim 6, further comprising:

a voltage conversion circuit provided between the motor driving circuit and the DC power source for converting a DC voltage supplied from the DC power source, wherein the noise checking part determines that no noise is influential when both of the first condition and a second condition are satisfied, the second condition being that a voltage supplied from the DC power source and the input voltage to the motor driving circuit are equal.

8. The motor driving system according to claim 1, wherein:

the second learning part starts to learn the offset value of the current sensor in the subject phase after a predetermined time delay for a recovery current to flow in the rectifying elements when the subject phase for learning the offset value of the current sensor is switched over to the subject phase from a non-subject phase of the three phases.

* * * * *